United States Patent
Inoue et al.

(10) Patent No.: US 6,461,426 B2
(45) Date of Patent: Oct. 8, 2002

(54) METHOD OF SUPPLYING SILICON RAW MATERIAL, METHOD OF PRODUCING SILICON SINGLE CRYSTAL, AND POLY-SILICON

(75) Inventors: Kuniharu Inoue; Jiro Inoue, both of Amagasaki; Hazimu Ohnishi, Osaka; Hisao Yamamoto, Takarazuka, all of (JP)

(73) Assignee: Sumitomo Metal Industries, Ltd., Osaka (JP)

( * ) Notice: Subject to any disclaimer, the term of this patent is extended or adjusted under 35 U.S.C. 154(b) by 0 days.

(21) Appl. No.: 09/726,611

(22) Filed: Dec. 1, 2000

(65) Prior Publication Data

US 2001/0010202 A1 Aug. 2, 2001

(51) Int. Cl.[7] ............................................. C30B 15/20
(52) U.S. Cl. .............................. 117/13; 117/14; 117/15
(58) Field of Search ................................ 117/13, 14, 15

(56) References Cited

U.S. PATENT DOCUMENTS 5,628,823 A  *  5/1997  Chandrasekhar et al. ..... 117/15
6,203,611 B1 *  3/2001  Kimbel et al. ................ 117/15

FOREIGN PATENT DOCUMENTS

JP         2000-313690 A     11/2000

\* cited by examiner

Primary Examiner—Felisa Hiteshew
(74) Attorney, Agent, or Firm—Morrison & Foerster LLP

(57) ABSTRACT

The production efficiency of silicon single crystal produced by additional charge or recharge method is improved by avoiding loss due to undissolved portion of poly-silicon rod supplied in the additional charge or recharge. A poly-silicon rod 20 as an additional charge is brought down in a silicon melt 11 in a crucible 10, while being directly supported by a seed crystal 40. The poly-silicon rod 20 is brought down to be totally supplied to the silicon melt 11, and then silicon single crystal 44 is pulled using the seed crystal 40.

1 Claim, 6 Drawing Sheets

METHOD OF SUPPLYING SILICON RAW MATERIAL, METHOD OF PRODUCING SILICON SINGLE CRYSTAL, AND POLY-SILICON

BACKGROUND OF THE INVENTION

1. Field of the Invention

This invention relates to a method of supplying poly-silicon, as a raw material for producing silicon single crystal by a CZ method, to a crucible to be molten therein, a method of producing silicon single crystal using the supplying method, and poly-silicon to be used as the silicon raw material therefor.

2. Description of the Prior Art

As is well known, in the production of silicon single crystal by the CZ method, poly-silicon blocks or granules are charged in a crucible before pulling the single crystal and molten to have a given quantity of the silicon melt, and pulling of the single crystal from the melt is started.

The silicon single crystal produced by this method is rapidly becoming larger in diameter and heavier, with the result that a charge quantity of raw material is increasingly required to be larger as far as possible.

Increased crucible size and/or charge level of raw material in the crucible are measures to cope with the above requirement. Increased crucible size, however, increases power consumption for melting and makes it more difficult to control melt temperature, and hence is not a desirable measure.

Increased charge level of raw material in a crucible, on the other hand, means that the raw material reaches the level close to the upper end of the crucible. The upper end, projecting upward beyond the heater, radiates more heat and tends to be lower in temperature than the other parts. Therefore, the raw material in the vicinity of the upper end cannot be molten completely, to partly stick fast to the inner crucible wall. This portion of the raw material applies a load to the crucible wall, deforming that portion of the crucible inwardly, to cause problems, e.g., decreased serviceability of the crucible, and dislocation of the crystals resulting from deformation of the crucible. Increased level of raw material, therefore, is also not a desirable measure.

A technique of additional charge is developed to cope with the above situations. Another technique of recharge also employs the similar charge supply method. These techniques are disclosed by Japanese Patent Application Laid-Open Nos. 2-188487, 3-12385, 8-169795 and 8-310892.

The additional charge method melts the initially charged poly-silicon blocks or granules in a crucible, and then additionally charges poly-silicon rod in the melt to be molten therein. This can increase a charge quantity of raw material without increasing crucible size or raw material charge level in the crucible.

The recharge method pulls silicon single crystal from a crucible, and additionally charges poly-silicon rod in the residual melt to recover the melt quantity, thereby allowing to repeat the pulling step without exchanging a crucible. This can enhance the productivity of silicon single crystal, reduce a crucible cost, and hence greatly reduce the production cost. This technique, together with the additional charge, is considered to be essential for increasing the diameter and weight of silicon single crystal.

BRIEF SUMMARY OF THE INVENTION

Object of the Invention

However, the conventional additional charge and recharge techniques involve the following problems:

Poly-silicon rod, when charged in a crucible, is brought down into the crucible while being suspended from the lower end of the pulling axis. FIG. 6 illustrates how the conventional method supports the poly-silicon rod 20. It is processed to have an annular groove, or a smaller-diameter section 22, over the outer periphery of the upper end, to be held by a molybdenum wire 50 as the supporting tool, wound on the section 22 and connected to the lower end of the pulling axis 30.

In this case, however, the wire as the supporting tool may contaminate the silicon melt, when immersed therein. It is therefore necessary to leave undissolved the upper end of the poly-silicon supported by the wire, which causes silicon loss.

The above procedure also needs, when the poly-silicon is dissolved in the melt, pulling the wire as the supporting tool together with the undissolved poly-silicon, to exchange it with the seed crystal for pulling the single crystal. Therefore, the silicon single crystal is produced by the following 8 steps:

(1) The poly-silicon rod is moved downward into the melt in a crucible.
(2) When it is dissolved, the undissolved portion and supporting tool are moved upward into a pull chamber.
(3) When the above step is completed, pressure within the pull chamber is released to the atmospheric pressure, after the gate valve between the pull chamber and main chamber is closed.
(4) The undissolved portion of the poly-silicon and supporting tool are taken out of the pull chamber.
(5) The seed chuck and seed crystal are attached to the lower end of the pulling axis.
(6) The pull chamber is evacuated again to produce a vacuum therein.
(7) The gate valve is opened, and the seed crystal is brought down into the main chamber.
(8) The seed crystal is immersed in the melt, subjected to the dipping, and pulled.

Compared with the conventional CZ pulling method, the additional charge step (1) needs additional steps (2) to (7). In particular, the step (4) for taking out the poly-silicon and supporting tool involves dangerous works because they are at high temperature, and hence needs a long cooling period. This causes the problems, lowered production efficiency of silicon single crystal by the additional charge method, and the production efficiency not increased as expected by the recharge method.

Moreover, contamination of the melt by the supporting tool is not completely ruled out, although it is kept apart from the melt.

Japanese Patent Laid-Open No. 8-169795 proposes a new supporting tool to replace the wire, and Japanese Patent Laid-Open No. 8-310892 proposes a technique to support poly-silicon rod. These methods, however, provide no solution to problems caused by the supporting tool, such as difficulty in dissolving the poly-silicon rod, lowered productivity, and contamination of the melt.

It is an object of the present invention to provide a method of supplying poly-silicon rod in a crucible without causing any risk of contamination by a supporting tool and loss due to an undissolved portion of silicon, while greatly improving the production efficiency of silicon single crystal. It is another object of the present invention to provide a method of producing silicon single crystal. It is still another object of the present invention to provide poly-silicon.

SUMMARY OF THE INVENTION

The method of the present invention for supplying a silicon raw material dissolves a poly-silicon rod, brought down in a crucible while being supported by a seed crystal, before the silicon single crystal is pulled by the CZ method.

The method of the present invention for producing a silicon single crystal dissolves a poly-silicon rod, brought down in a crucible while being supported by a seed crystal, before the silicon single crystal is pulled by the CZ method, and then immerses the seed crystal in the silicon melt in the crucible, which is pulled as the silicon single crystal by the CZ method.

Both methods of the present invention, one for supplying the silicon raw material and the other for producing a silicon single crystal, are applicable to the additional charge and recharge methods.

In the method of the present invention, whether it is applied to the additional charge or recharge method, it is necessary to pull the silicon single crystal from the silicon melt, after the poly-silicon rod is additionally supplied to the silicon melt in a crucible, and the seed crystal is immersed in the silicon melt in the pulling process.

In the method of the present invention, whether it is for supplying the silicon raw material or for producing a silicon single crystal, a seed crystal which causes no problem when immersed in the silicon melt is used to support the poly-silicon rod. Supplying the poly-silicon together with the seed crystal to totally immerse the former allows to start pulling the silicon single crystal by the CZ method no sooner than the poly-silicon is dissolved. As a result, the above-described steps (2) to (7) can be saved, to greatly improve the production efficiency of silicon single crystal. At the same time, this removes risk of contamination of the melt by the supporting tool and avoids loss of the undissolved portion of silicon.

A supporting tool of silicon which is substantially free of risk of contamination can be used to support the poly-silicon by the seed crystal. However, it is preferable, viewed from cost, to dispense with the supporting tool and directly support the poly-silicon at the lower end of the seed crystal. It can be directly supported by the seed crystal, when hung on the lower end which is made larger in diameter than the seed body. In this case, the poly-silicon is provided with a cavity in the upper end, into which the larger-diameter lower end is fit to hold the poly-silicon.

The larger-diameter section, on which the poly-silicon is hung, can be formed at the lower end of the seed crystal by machining. It can be also formed during the necking step after the seed crystal is immersed in the silicon melt in a crucible, where the larger-diameter section is formed in the neck. In this case, the seed crystal with the larger-diameter section can be reused for supplying the raw material and pulling the single crystal, when the pulled silicon single crystal is separated from the seed crystal below the larger-diameter section. It eliminates the needs for machining to form the large-diameter section and operation for changing the seed crystal upon recharging.

The poly-silicon of the present invention is a rod, to be used as the silicon raw material for the silicon single crystal pulled by the CZ method. In this case, the poly-silicon is provided with a cavity in the end, into which the larger-diameter lower end is fit to hold the poly-silicon. The poly-silicon is immersed in the silicon melt in a crucible together with the seed crystal, by which it is directly supported at the lower end of the seed crystal. This allows to start pulling the silicon single crystal by the CZ method no sooner than the poly-silicon is dissolved. As a result, the production efficiency of silicon single crystal is greatly improved. At the same time, this removes risk of contamination of the melt by the supporting tool and avoids loss of the undissolved portion of silicon.

DETAILED DESCRIPTION OF THE PREFERRED EMBODIMENTS

Figure 1:
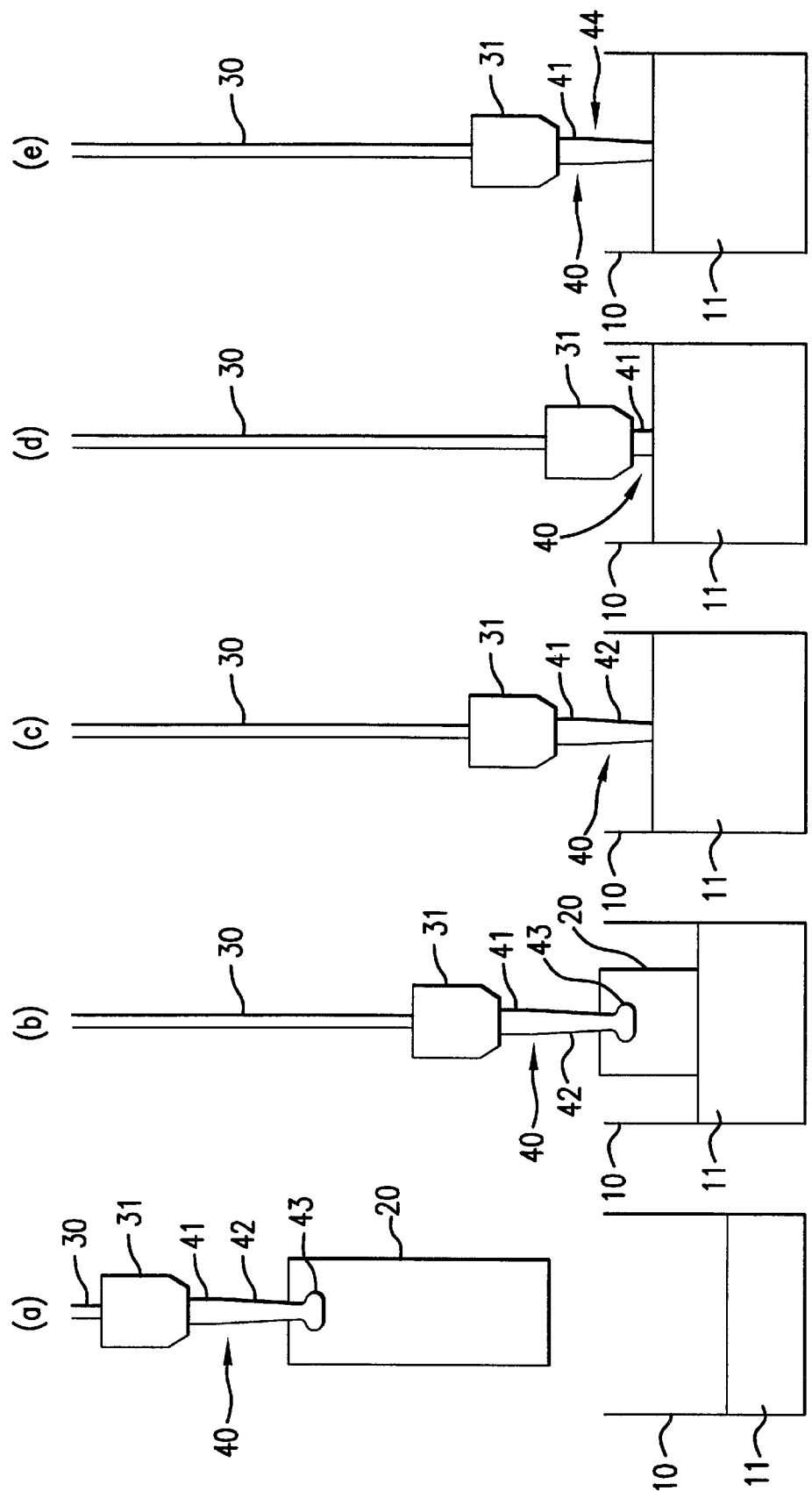
FIG. 1 illustrates a production process of silicon single crystal as one of the preferred embodiments of the present invention.
Figure 2:
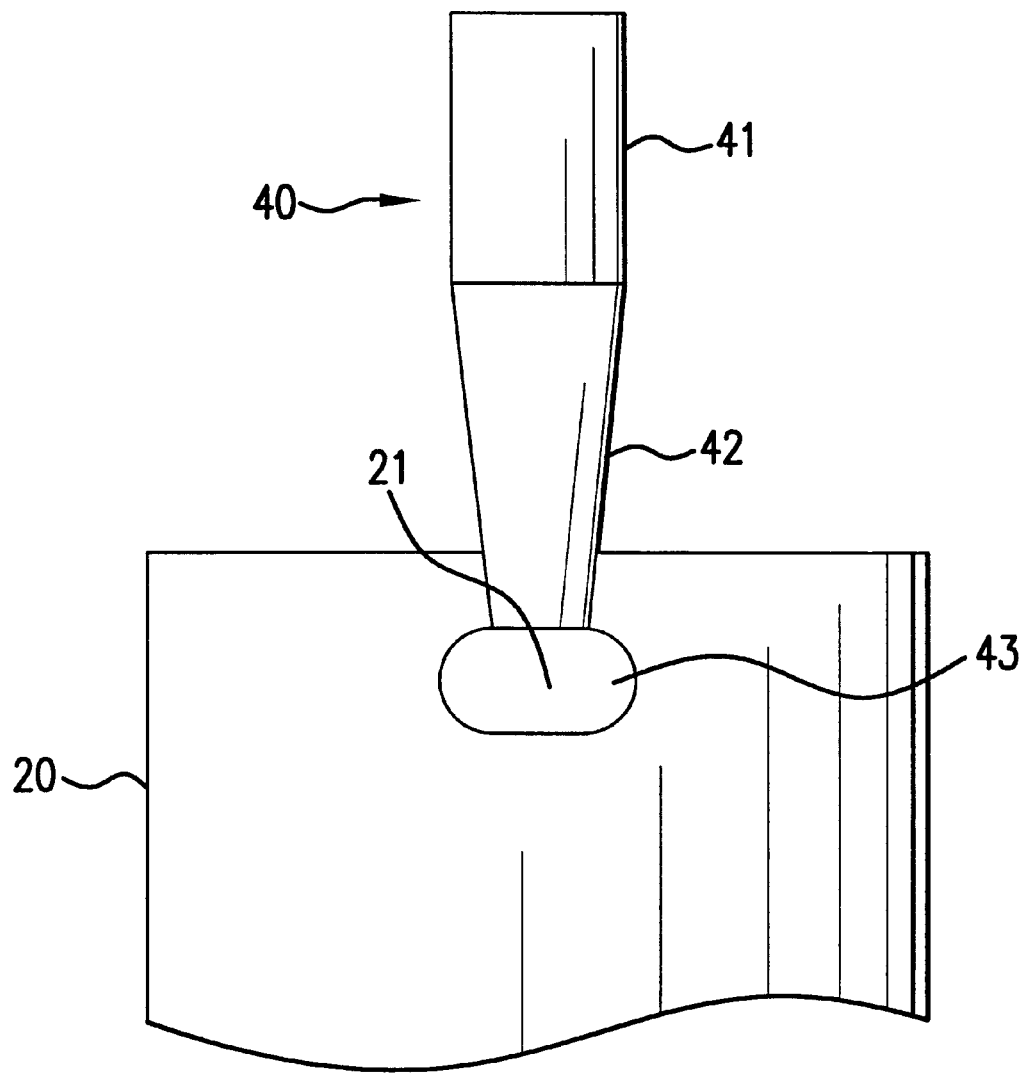
FIG. 2 illustrates one embodiment of supporting a poly-silicon by a seed crystal.
Figure 3:
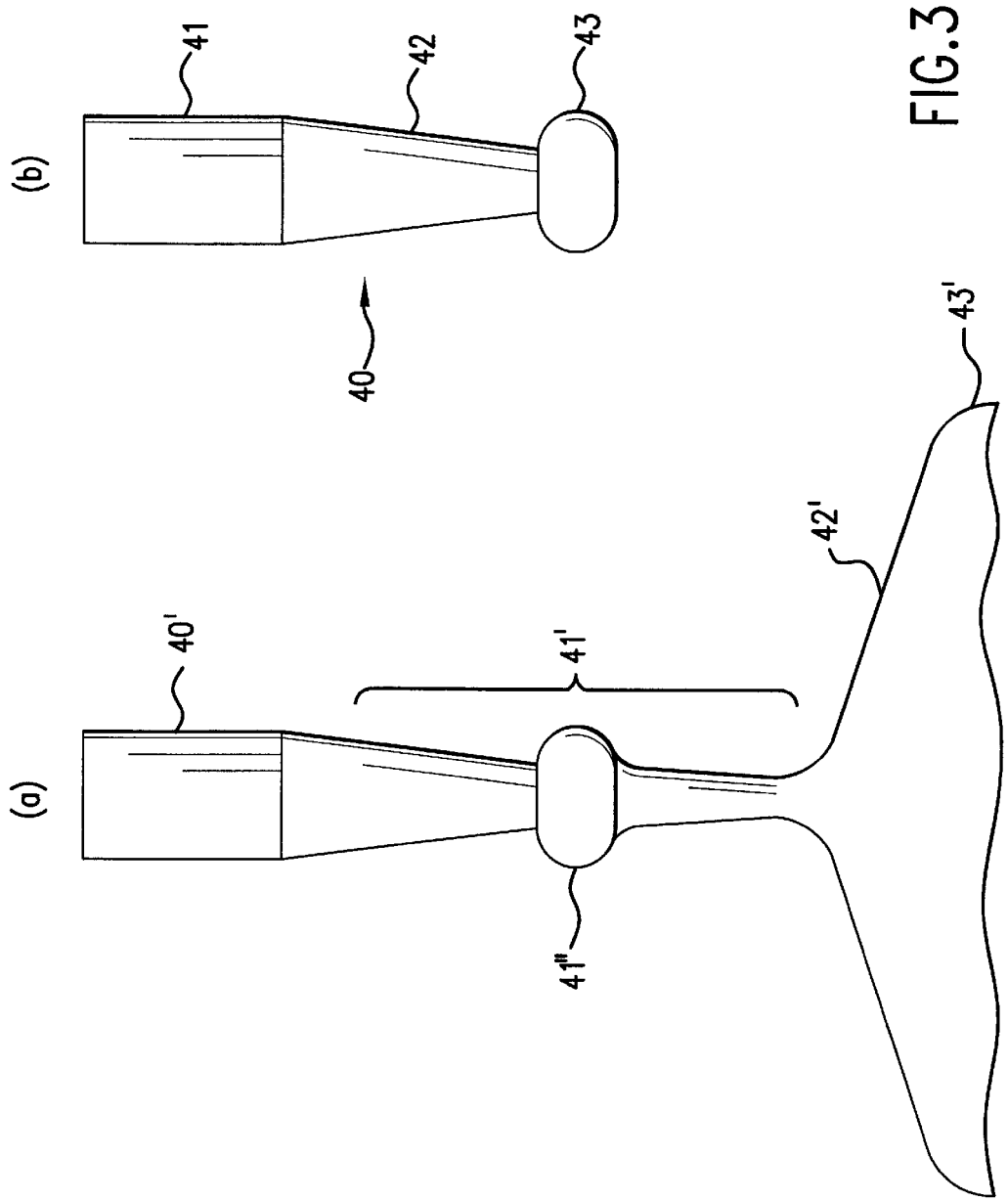
FIG. 3 illustrate a process of forming a larger-diameter section in the lower end of the seed crystal, on which the poly-silicon is hung.
Figure 4:
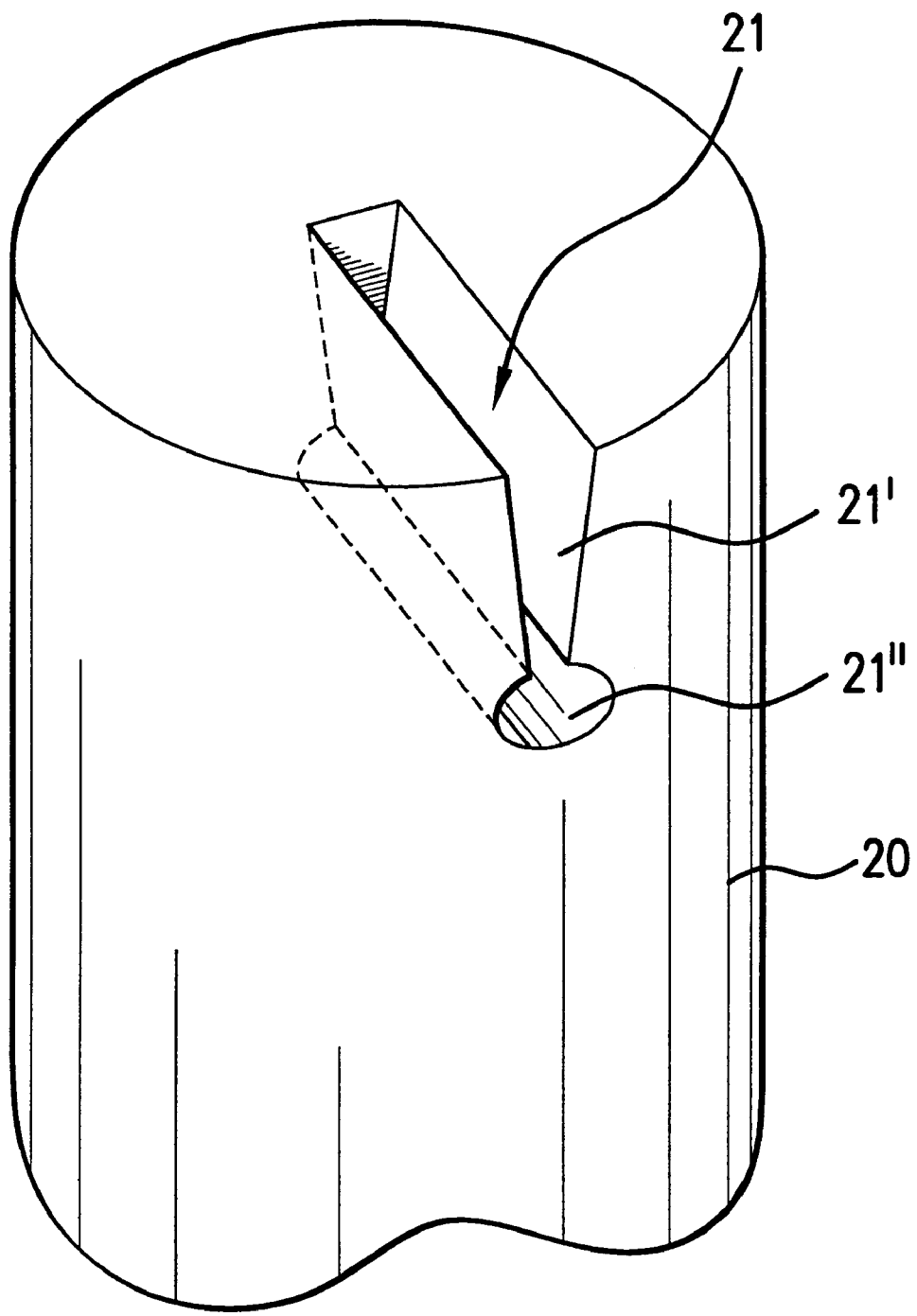
FIG. 4 is an oblique view of the upper end shape of the poly-silicon.

The preferred embodiments of the present invention are described by referring to the drawings. FIG. 1 illustrates a production process of silicon single crystal as one of the preferred embodiments of the present invention. FIG. 2 illustrates one embodiment of supporting a poly-silicon by a seed crystal. FIG. 3 illustrates a process of forming a larger-diameter section in the lower end of the seed crystal, on which the poly-silicon is hung. FIG. 4 is an oblique view of the upper end shape of the poly-silicon.

Referring to FIG. 1(a), poly-silicon rod 20 as the silicon raw material is suspended over the crucible 10, before the silicon single crystal is pulled by the CZ method. The crucible 10 contains the melt of silicon raw material 11, which is an initial melt of raw material formed by melting the poly-silicon blocks or granules in the case of additional charge method, and residual melt left by the pulled silicon single crystal in the case of recharge method.

The poly-silicon rod 20 is suspended from and directly supported by the seed crystal 40 attached to the seed holder 31, which is connected to the lower end of the pulling axis 30. The seed crystal 40 is composed of the body section 41 having a square section, constricted section 42 continuously formed from the body section 41, and larger-diameter section 43, on which the poly-silicon 20 is hung, also continuously formed from the constricted section 42 (FIG. 2).

The body section 41 of the seed crystal 40 is a rod, with a square section corresponding to the common seed crystal. The constricted section 42 has a circular section and is tapered with the diameter gradually decreasing downward. The larger-diameter section 43, on which the poly-silicon 20 is hung, has a sufficiently larger diameter than the lower end of the constricted section 42.

The seed crystal 40 is prepared by the necking step during the single-crystal pulling process by the CZ method, where the necking step is specially devised for this purpose (FIG. 3). Referring to FIG. 3(a), the seed crystal 40' is immersed in the raw material melt in a crucible, drawn to decrease its diameter (i.e., necking step) when pulling the silicon single crystal by the CZ method is started, and then processed to form the body section. One of the purposes of this necking step is to remove the dislocations. As a result, the neck section 41', shoulder section 42' and cylindrical section 43' are formed, in this order, from the seed crystal 40'.

For production of the seed crystal 40, a larger-diameter section 41" is formed in the middle of the neck section 41' by controlling, e.g. pulling rate during the necking step, and the neck section 41' is cut, on completion of the pulling step, at below the larger-diameter section 41", to separate the single-crystal (FIG. 3(b)). The residual portion is the seed crystal 40, with the body section 41, constricted section 42 and larger-diameter section 43, on which the poly-silicon is to be hung, arranged in this order.

The above procedure for producing the seed crystal 40 dispenses with the machining step for forming the larger-diameter section on which the poly-silicon is hung. The seed crystal 40 thus produced can be directly reused for the next raw material supplying and pulling steps in the case of the recharge method.

In this embodiment, the poly-silicon rod 20 is directly suspended over the crucible 10 from the seed crystal 40 prepared above. The poly-silicon is provided with the cavity 21 in the upper end, into which the larger-diameter section 43 in the lower end of the seed crystal 40 is fit to hold the poly-silicon.

FIG. 4 illustrates the cavity 21. It is a groove mechanically cut in the poly-silicon 20 from the center to the outer periphery, the groove width corresponding to the lower end shape of the seed crystal 40. More concretely, the groove 21 comprises the lower section 21" and upper section 21', the former being a wider section into which the larger-diameter section 43 of the seed crystal 40 is fit, and the latter being a tapered section into which the lower end of the constricted section 42 is fit.

For supporting the poly-silicon 20, the lower end of the seed crystal 40 is inserted into the cavity 21 in the poly-silicon 20 from the side to the center. As a result, the poly-silicon 20 is supported concentrically by the seed crystal 40 below the pulling axis 30 and suspended over the crucible 10, as shown in FIG. 1(a).

It is recommended to suspend the poly-silicon 20 before melting of the initial raw material charge is started in the case of the additional charge method, because the poly-silicon 20 can be preheated by the heat for melting the initial charge.

It is needless to say that the constricted section 42 must have a sufficient sectional area to withstand the load of the poly-silicon 20, even at the narrowest section.

On completion of suspension of the poly-silicon 20, and melting of the initial charge in the case of the additional charge method, the pulling axis 30 is brought down as shown in FIG. 1(b), to immerse and melt the poly-silicon 20 in the raw material melt 11 in the crucible 10, gradually from its bottom. Quantity of the melt in the crucible increases, as a result.

Supplying of the silicon raw material to the crucible 10 is continued until the poly-silicon 20 is completely dissolved, as shown in FIG. 1(c). When the supply of the raw material is completed, the lower end of the seed crystal 40, including the larger-diameter section 43 fit into the cavity 21 of the poly-silicon 20, is dissolved, which, however, causes no contamination of the raw material melt 11 because the seed crystal itself is silicon single crystal.

When the supply of the silicon raw material is completed, the pulling axis 30 is further brought down, to dissolve the constricted section 42 as the neck of the seed crystal 40, and immerse the body section 41 in the raw material melt 11, as shown in FIG. 1(d). Then, pulling of the new silicon single crystal 44 is started by the CZ method, as shown in FIG. 1(e).

In this embodiment, the poly-silicon 20 can be totally dissolved, because it is additionally supplied to the raw material melt 11 while being directly supported by the seed crystal 40 for pulling the silicon single crystal by the CZ method. This brings about several advantages; first, no loss of the undissolved portion of the poly-silicon.

Second, pulling of the silicon single crystal by the CZ method can be started no sooner than supplying of the poly-silicon 20 is completed. As a result, the above described steps (2) to (7) required for the conventional additional charge and recharge methods to remove the undissolved portion and supporting tool can be saved, to greatly improve the production efficiency of silicon single crystal for the conventional additional charge and recharge methods.

Third, there is no risk of contamination of the melt 11, in spite of total dissolution of the poly-silicon 20 supplied to the melt 11.

In this embodiment, moreover, the seed crystal 40 with the larger-diameter section, on which the poly-silicon is hung, is prepared during the necking step for CZ pulling method, dispensing with the machining step for forming the larger-diameter section. The seed crystal with the larger-diameter section can be directly reused for the next pulling step in the case of the recharge method, thus dispensing with the step of exchanging the seed crystal 40.

The larger-diameter section can be formed repeatedly during the necking step for one seed crystal, and it is possible to use only one seed crystal for the recharge method.

An initial charge (120 kg) of the poly-silicon blocks or granules is molten in a quartz crucible (diameter: 22 inches), and an additional charge (40 kg) of poly-silicon rod is brought down into the melt, to produce the silicon single crystal with a diameter of 8 inches in size, by the additional charge method.

On completion of pulling of the silicon single crystal, an additional charge (150 kg) of poly-silicon rod is further brought down into the residual melt (10 kg) in the crucible, to again produce the silicon single crystal, 8 inches in size, by the recharge method.

The conventional method which uses a supporting tool of molybdenum wire for additionally charging poly-silicon needs approximately 3 hours from completion of melting of a given quantity of the poly-silicon rod to start dipping of the seed crystal, whether it is for additional charge or recharge method. The method of the present invention, which uses the seed crystal for additional charge of the poly-silicon, greatly reduces the above period to only 10 minutes or so, which is required for adjusting the melt before starting the dipping step.

When the same quantities of the initial charge and additional charges are to be processed by the conventional method, 5 kg of poly-silicon as the additional charge must be left undissolved to avoid contamination of the melt by a supporting tool of molybdenum. This means that the additional charge is essentially only 35 kg for the additional charge method and 145 kg for the recharge method. The method of the present invention, on the other hand, can totally process the additional charges both for the additional charge and recharge methods.

The seed crystal 40 used in the method of the present invention for supporting the poly-silicon is a narrow rod having a total length of 220 mm, composed of the 18 mm square body section 41, constricted section 42 having the minimum diameter of 8 mm, and larger-diameter section 43 having an outer diameter of 20 mm, which is to be fit into the 30 mm deep cavity 21 formed on the upper end of the poly-silicon 20.

Figure 5:
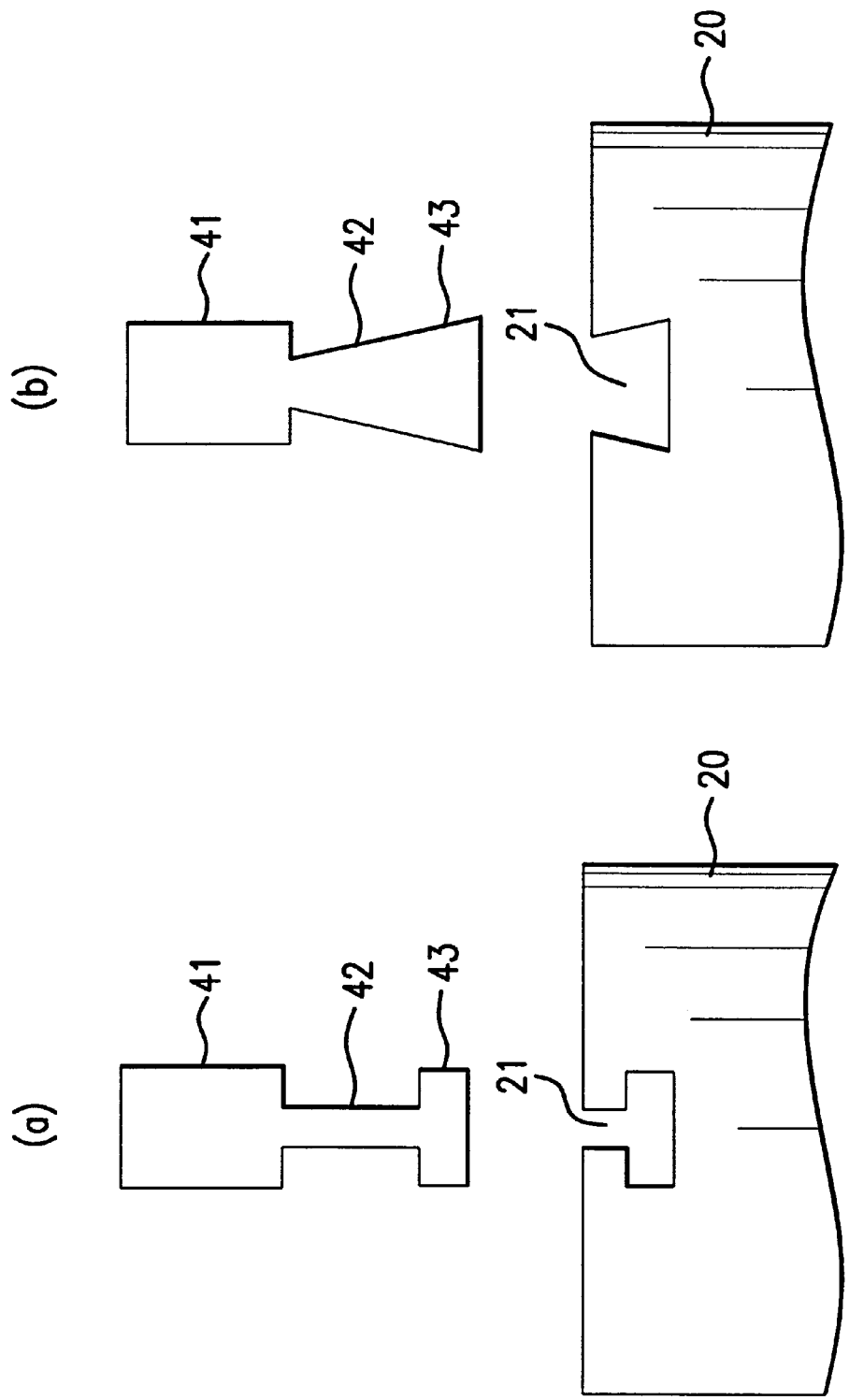
FIG. 5 illustrates another embodiment of supporting a poly-silicon by a seed crystal.
Figure 6:
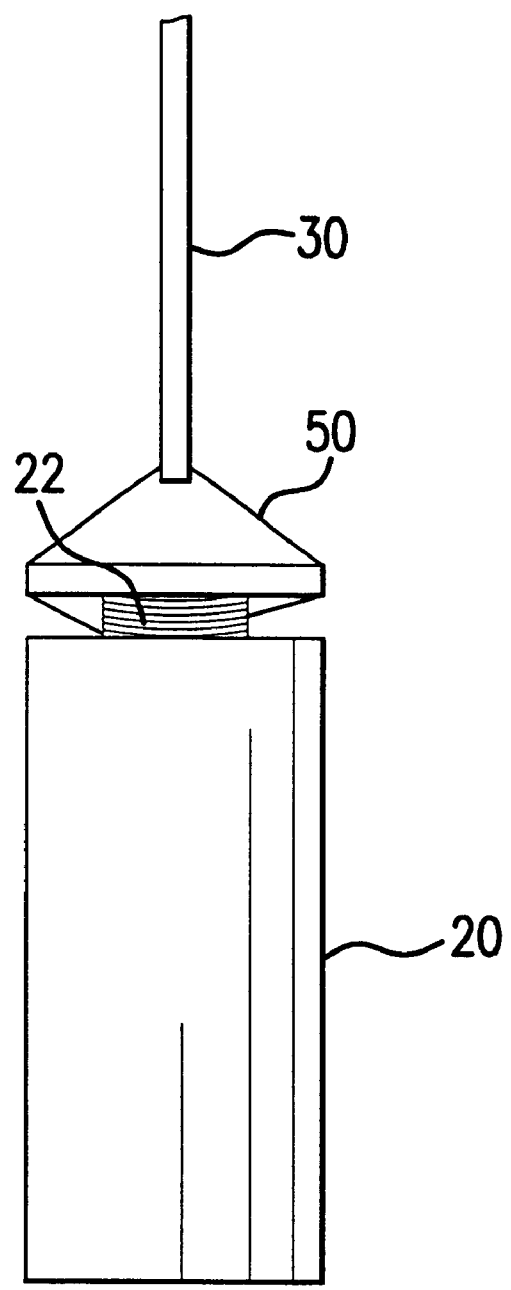
FIG. 6 illustrates the conventional method of supporting a poly-silicon.

FIG. 5 illustrates other forms of supporting the poly-silicon by the seed crystal.

The seed crystal 40 for supporting the poly-silicon rod 20 is provided with the larger-diameter section during the necking step in the CZ pulling process in the above embodiment. These sections can be provided by machining, as shown in FIGS. 5(*a*) and (*b*).

The seed crystal 40 shown in FIG. 5(*a*) is provided with the cylindrical constricted section 42 and larger-diameter section 43, on which the poly-silicon is to be hung, below the body section 41 by machining. The seed crystal 40 shown in FIG. 5(*b*) is provided with the constricted section 42 and larger-diameter section 43, also by machining, forming a continuous cone below the body section 41 of a square rod. On the other hand, the poly-silicon 20 is provided with the groove-shaped cavity 21, into which the corresponding lower end of the seed crystal 40 including the larger-diameter section 43 is fit, formed by machining on the upper end from the center to the outer periphery (FIG. 4).

Use of the seed crystal 40 of any shape above to directly support the poly-silicon 20 removes risk of contamination by the supporting tool and avoids loss of the undissolved portion of silicon, thereby greatly improving the production efficiency of silicon single crystal.

Shape of the seed crystal 40 for supporting the poly-silicon is not limited to the above described ones, and can be freely designed. Any supporting or connecting tool can also be used together with the seed crystal 40, so long as it causes no problem, when dissolved in the melt.

As described above, the method of supplying silicon raw material and method of producing silicon single crystal of the present invention use the seed crystal for pulling the silicon single crystal by the CZ method to support the poly-silicon rod supplied to the crucible, in order to remove risk of contamination by the supporting tool and avoid loss of the undissolved portion of silicon, thereby greatly improving the production efficiency of silicon single crystal. Therefore, they can produce large-size, heavy silicon single crystal of high quality at a low cost.

The poly-silicon of the present invention, supplied to the silicon melt in the crucible together with the seed crystal while directly supported by the seed crystal at its lower end, particularly efficiently removes risk of contamination by the supporting tool. At the same time, it greatly improves the production efficiency of silicon single crystal, and avoids loss of the undissolved portion of silicon.

What is claimed is:

1. A method of producing silicon single crystal, comprising:

bringing a poly-silicon rod as silicon raw material down in a crucible to be melted therein while being supported by seed crystal, before the silicon single crystal is pulled by a CZ method;

immersing the seed crystal in a silicon melt in the crucible; and pulling the silicon single crystal by the CZ method, the seed crystal being provided with a large diameter section on which the poly-silicon rod is to be hung and supported during a necking step after the seed crystal is immersed in the silicon melt.

\* \* \* \* \*